(12) United States Patent
Petersen et al.

(10) Patent No.: US 12,725,567 B2
(45) Date of Patent: Sep. 1, 2026

(54) OPTOELECTRONIC COMPONENT, METHOD FOR OPERATING AN OPTOELECTRONIC COMPONENT AND METHOD FOR PRODUCING AN OPTOELECTRONIC COMPONENT

(71) Applicant: ams-OSRAM International GmbH, Regensburg (DE)

(72) Inventors: Gunnar Petersen, Regensburg (DE); Daniel Richter, Bad Abbach (DE)

(73) Assignee: ams-OSRAM International GmbH, Regensburg (DE)

( * ) Notice: Subject to any disclaimer, the term of this patent is extended or adjusted under 35 U.S.C. 154(b) by 0 days.

(21) Appl. No.: 19/108,380

(22) PCT Filed: Sep. 15, 2023

(86) PCT No.: PCT/EP2023/075503
§ 371 (c)(1),
(2) Date: Mar. 3, 2025

(87) PCT Pub. No.: WO2024/056886
PCT Pub. Date: Mar. 21, 2024

(65) Prior Publication Data

US 2026/0073844 A1 Mar. 12, 2026

(30) Foreign Application Priority Data

Sep. 15, 2022 (DE) ..................... 10 2022 123 582.3

(51) Int. Cl.
*G09G 3/30* (2006.01)
*G09G 3/32* (2016.01)
(Continued)

(52) U.S. Cl.
CPC ............... *G09G 3/32* (2013.01); *H10H 29/20* (2025.01); *H10W 90/00* (2026.01);
(Continued)

(58) Field of Classification Search
CPC ............. G09G 3/32; G09G 2300/0426; G09G 2320/0626; G09G 2330/021; G09G 3/3283; H10H 29/20; H10W 90/00; H10D 64/035
(Continued)

(56) References Cited

U.S. PATENT DOCUMENTS

2009/0184346 A1* 7/2009 Jain ...................... H10D 64/035 257/314
2010/0253710 A1* 10/2010 Rankov ................ G09G 3/3283 345/204

(Continued)

FOREIGN PATENT DOCUMENTS

JP 2008-058446 A 3/2008
WO 2018/219868 A1 12/2018

OTHER PUBLICATIONS

Bogdanov et al., "Material platforms for integrated quantum photonics", Optical Materials Express, vol. 7, No. 1, Jan. 1, 2017, pp. 111-132.

(Continued)

*Primary Examiner* — Abdul-Samad A Adediran
(74) *Attorney, Agent, or Firm* — ArentFox Schiff LLP

(57) ABSTRACT

An optoelectronic component comprises a field effect transistor that is implemented in a first die and has a source and a sink. The field effect transistor is implemented as a floating-gate transistor with a control electrode and an isolated gate electrode. The optoelectronic component further comprises a light diode that is implemented in a second die and has an anode and a cathode. The second die is arranged on an upper side of the first die. The light diode and a channel of the field effect transistor are electrically connected in series.

20 Claims, 9 Drawing Sheets

(51) Int. Cl.
*H10H 29/20* (2025.01)
*H10W 90/00* (2026.01)

(52) U.S. Cl.
CPC ............... *G09G 2300/0426* (2013.01); *G09G 2320/0626* (2013.01); *G09G 2330/021* (2013.01)

(58) Field of Classification Search
USPC ........................................... 257/314; 345/204
See application file for complete search history.

(56) References Cited

U.S. PATENT DOCUMENTS

2013/0221368 A1 8/2013 Oraw
2018/0358339 A1 12/2018 Iguchi
2019/0385513 A1 12/2019 Iguchi et al.

OTHER PUBLICATIONS

Fang et al., "Electrically pumped hybrid A1GalnAs-silicon evanescent laser", Optics express, vol. 14, No. 20, Oct. 2, 2006, pp. 9203-9210.

International Search Report and Written Opinion received for PCT Patent Application No. PCT/EP2023/075503, mailed on Dec. 11, 2023, 17 pages (5 pages of English Translation and 12 pages of Original Document).

Lee et al., "Introduction to Flat Panel Displays", Wiley-SID Series in Display Technology, 2008, 281 pages.

Roelkens et al., "Hybrid Silicon Lasers", Proceedings of SPIE—The International Society for Optical Engineering, 2011, pp. 1-9.

Search report received for German Patent Application No. 102022123582.3, mailed on Mar. 3, 2023, 5 pages. (Original Copy Only).

Silverstone et al., "Silicon Quantum Photonics", IEEE Journal of selected topics in quantum electronics, vol. 22, No. 6, 2016, 6700113, pp. 1-13.

Wang et al., "On-chip silicon photonic signaling and processing: a review", Science Bulletin, vol. 63, 2018, pp. 1267-1310.

* cited by examiner 10
600
200
150
100
102
720,721
220
300
400
210
110
340
320
130
350
360
330
310
510
420
410
120
711
712
710,711
721
722
520

OPTOELECTRONIC COMPONENT, METHOD FOR OPERATING AN OPTOELECTRONIC COMPONENT AND METHOD FOR PRODUCING AN OPTOELECTRONIC COMPONENT

CROSS-REFERENCE TO RELATED APPLICATIONS

The present application is a U.S. national stage application of International Patent Application PCT/EP2023/075503, filed on Sep. 15, 2023, which claims the priority of German patent application DE 10 2022 123 582.3 filed on Sep. 15, 2022, the entire contents of which are hereby incorporated by reference in their entireties.

SUMMARY

Switching optoelectronic components, such as light-emitting diode components, using transistors is known.

One object of the present invention is to provide an optoelectronic component. A further object of the present invention is to specify a method for operating an optoelectronic component. A further object of the present invention is to specify a method for producing an optoelectronic component. These objects are achieved by an optoelectronic component, by a method for operating an optoelectronic component, and by a method for producing an optoelectronic component having the features of the independent claims. Various refinements are specified in the dependent claims.

An optoelectronic component comprises a field-effect transistor, which is formed in a first partial chip, having a source and a drain. The field-effect transistor is configured as a floating gate transistor having a control electrode and an isolated gate electrode. The optoelectronic component furthermore comprises a light-emitting diode formed in a second partial chip having an anode and a cathode. The second partial chip is arranged on an upper side of the first partial chip. The light-emitting diode and a channel of the field-effect transistor are electrically connected in series.

The arrangement of the second partial chip on the upper side of the first partial chip can be referred to as monolithic integration. Due to the monolithic integration of the first partial chip and the second partial chip, this optoelectronic component can have extremely compact external dimensions. This is assisted in that due to the monolithic integration, fewer connections have to be led outward and thus less space is required for contact surfaces. The monolithic integration can additionally enable energy-efficient operation of the optoelectronic component. The monolithic integration can also enable the optoelectronic component to be switched at high speed.

The field-effect transistor of this optoelectronic component is used to set a desired brightness value of the light-emitting diode of the optoelectronic component. The isolated gate electrode of the field-effect transistor configured as a floating gate transistor forms a nonvolatile memory here, in which a desired brightness value remains stored until it is changed. An active actuation of the optoelectronic component is thus only necessary when the desired brightness of the light-emitting diode changes. This can enable particularly simple, cost-effective, rapid, and energy-efficient operation of the optoelectronic component.

In one embodiment of the optical component, the cathode of the light-emitting diode is electrically conductively connected to the drain of the field-effect transistor. The anode of the light-emitting diode forms a supply contact. The source of the field-effect transistor forms a reference contact. A supply voltage can be applied between the supply contact and the reference contact. In this variant, a series circuit thus results between the light-emitting diode and the channel of the field-effect transistor, wherein a supply voltage can be applied between the anode of the light-emitting diode and the source of the field-effect transistor.

In another embodiment of the optoelectronic component, the anode of the light-emitting diode is electrically conductively connected to the drain of the field-effect transistor. The source of the field-effect transistor forms a supply contact. The cathode of the light-emitting diode forms a reference contact. A supply voltage can be applied between the supply contact and the reference contact. The light-emitting diode and the channel of the field-effect transistor are therefore also electrically connected in series in this variant. A supply voltage can be applied between the source of the field-effect transistor and the cathode of the light-emitting diode.

In one embodiment of the optoelectronic component, the control electrode of the field-effect transistor, the supply contact, and the reference contact can be electrically contacted on a lower side of the first partial chip. These contacts advantageously already enable a complete actuation of the optoelectronic component. The optoelectronic component can thus be formed having compact external dimensions.

In one embodiment of the optoelectronic component, the drain of the field-effect transistor can also be electrically contacted at the lower side of the first partial chip. Even more flexible actuation of the optoelectronic component is thus advantageously enabled. An alternative method for charging the isolated gate electrode of the field-effect transistor can thus be enabled, for example.

In one embodiment of the optoelectronic component, the first partial chip comprises a through contact, via which the light-emitting diode and the channel of the field-effect transistor are electrically connected in series. Not all internal contacts of the light-emitting diode and the field-effect transistor thus advantageously have to be led to the outer side of the optoelectronic component.

In one embodiment of the optoelectronic component, the first partial chip is formed as a silicon chip. The second partial chip is formed as a III-V semiconductor chip. The partial chips of the optoelectronic component thus have semiconductor systems optimized for their respective use. In spite of the different semiconductor systems, a monolithic integration of the two partial chips is implemented by the arrangement of the second partial chip on the upper side of the first partial chip.

In one embodiment of the optoelectronic component, the field-effect transistor comprises, in addition to the control electrode and the isolated gate electrode, a further control electrode and a further isolated gate electrode. The field-effect transistor therefore comprises at least two sets of control and gate electrodes. This enables one set of control and gate electrodes to be used for the permanent compensation of a component-individual property, while the other set of control and gate electrodes is used to set a variable brightness of the light-emitting diode.

In one embodiment of the optoelectronic component, the light-emitting diode and the field-effect transistor jointly form a pixel of the optoelectronic component. The optoelectronic component comprises a plurality of further equivalent pixels here. All pixels are jointly monolithically integrated. The optoelectronic component can be configured, for example, as a display screen in this variant. The brightness of all pixels of this optoelectronic component can advantageously be individually set.

In one embodiment of the optoelectronic component, the isolated gate electrodes of two pixels have different lateral extensions. This can enable, for example, component-individual differences between the light-emitting diodes of the two pixels to be compensated for.

In one embodiment of the optoelectronic component, the pixels are arranged in a matrix array having rows and columns. The sources of the field-effect transistors of the pixels are electrically short-circuited row by row here. The anodes of the light-emitting diodes of the pixels are electrically short-circuited column by column. It is thus advantageously made possible to reduce the number of the required external electrical contacts of the optoelectronic component still further. Only one individual electrical contact can be required per pixel. In addition, one electrical contact per column and one electrical contact per row of the matrix array or even only a total of two further electrical contacts can be required.

In another embodiment of the optoelectronic component, the pixels are arranged in a matrix array having rows and columns. The sources of the field-effect transistors of the pixels are electrically short-circuited row by row here. The cathodes of the light-emitting diodes of the pixels are electrically short-circuited column by column. In this arrangement also, only one individual external electrical contact can advantageously be required per pixel. In addition, one electrical contact per column and one electrical contact per row or even only a total of two further electrical contacts can be required.

A method for operating an optoelectronic component of the above-described type comprises steps for applying an electric charge to the isolated gate electrode and for energizing the light-emitting diode. A desired brightness value of the light-emitting diode is set using the electric charge applied to the isolated gate electrode. The electric charge applied to the isolated gate electrode advantageously remains permanently or at least for an extended period of time on the gate electrode. This enables the desired brightness of the light-emitting diode to be set persistently using a one-time write process. Subsequently, further actuation of the field-effect transistor of the optoelectronic component is no longer required until the desired brightness of the light-emitting diode changes. A more simple, cost-effective, rapid, and energy efficient operation of the optoelectronic component is thus advantageously enabled.

In one embodiment of the method, an electric charge is applied to the isolated gate electrode by applying a positive electric voltage between the control electrode and the source of the field-effect transistor. Electric charge can reach the isolated gate electrode here, for example, through Fowler-Nordheim tunneling.

In another embodiment of the method, an electric charge is applied to the isolated gate electrode by applying a positive electric voltage between the drain of the field-effect transistor and the source of the field-effect transistor and applying a positive electric voltage between the control electrode and the drain of the field-effect transistor. Electric charges can reach the isolated gate electrode here, for example, by way of the channel hot electron method.

In one embodiment of the method, the light-emitting diode is energized by applying a positive supply voltage between the supply contact and the reference contact. Current then advantageously flows through the series circuit made up of the light-emitting diode and the channel of the field-effect transistor, due to which the field-effect transistor enables setting of the brightness of the light emitted by the light-emitting diode.

In one embodiment of the method, it comprises a further step of removing at least a part of the electric charge located on the isolated gate electrode. This method step enables a change of the brightness of the light emitted by the light-emitting diode.

In one embodiment of the method, at least a part of the electric charge located on the isolated gate electrode is removed by applying a positive electric voltage between the source of the field-effect transistor and the control electrode. This enables charge carriers to leave the isolated gate electrode of the field-effect transistor via a tunneling effect.

A method for producing an optoelectronic component comprises steps of providing a field-effect transistor, which is formed in a first partial chip, having a source and a drain, wherein the field-effect transistor is configured as a floating gate transistor having a control electrode and an isolated gate electrode, providing a light-emitting diode, which is formed in a second partial chip, having an anode and a cathode, and arranging the second partial chip on an upper side of the first partial chip, wherein the light-emitting diode and a channel of the field-effect transistor are electrically connected in series. The field-effect transistor is intended to set a brightness value of the light-emitting diode. This method advantageously enables a production of a monolithically integrated optoelectronic component having compact external dimensions.

In one embodiment of this method, it comprises further steps of detecting an electro-optical property of the light-emitting diode and adapting a lateral extension of the isolated gate electrode of the field-effect transistor as a function of the detected electro-optical property. A component-individual variability of the detected electro-optical property of the light-emitting diode can advantageously be compensated for by the adaptation of the lateral extension of the isolated gate electrode. For example, the lateral extension of the isolated gate electrode of the field-effect transistor can be adapted so that a brightness of the light-emitting diode has a desired target value in spite of a component-individual deviation.

The above-described properties, features, and advantages of this invention, and the manner in which they are achieved will become clearer and more comprehensible in conjunction with the following description of the exemplary embodiments, which are explained in more detail in conjunction with the drawings. In the respective schematic figures,

BRIEF DESCRIPTION OF THE DRAWINGS

FIG. 11 shows a sectional view of this variant of the optoelectronic component;

FIG. 12 shows a sectional view of two pixels of a further variant of an optoelectronic component.

DETAILED DESCRIPTION

Figure 1:
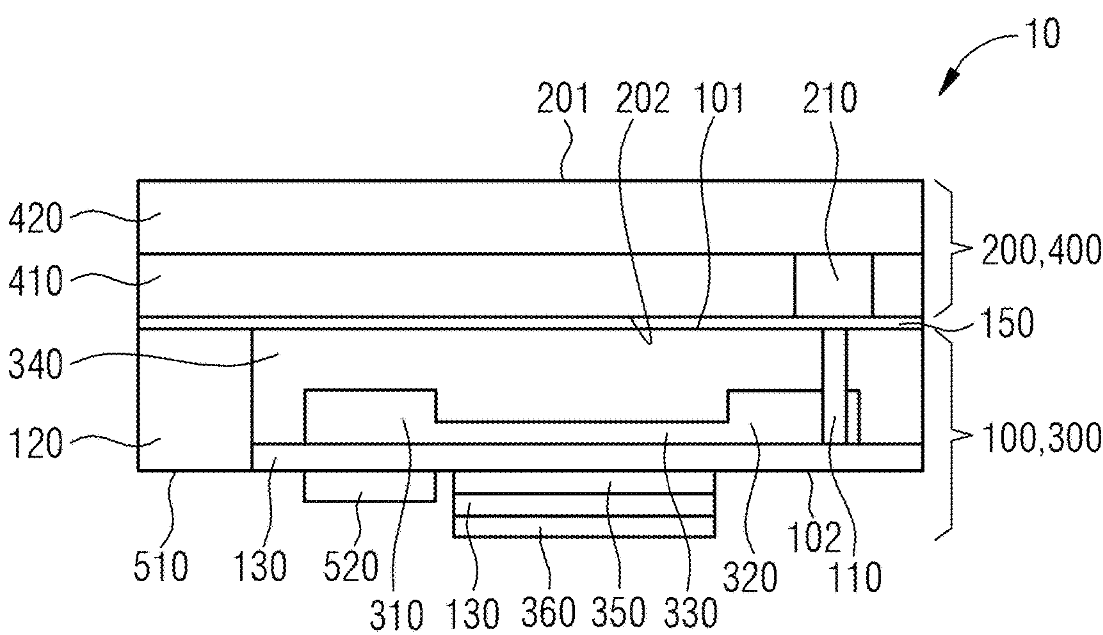
FIG. 1 shows a sectional side view of an optoelectronic component.

FIG. 1 shows a schematic sectional side view of a first variant of an optoelectronic component 10. The optoelectronic component 10 is intended to emit electromagnetic radiation, for example, visible light, with settable brightness. The optoelectronic component 10 can therefore, for example, form a pixel.

The optoelectronic component 10 comprises a first partial chip 100 and a second partial chip 200. The first partial chip 100 comprises an upper side 101 and a lower side 102 opposite to the upper side 101. The second partial chip 200 comprises an upper side 201 and a lower side 202 opposite to the upper side 201. The second partial chip 200 is arranged on the upper side 101 of the first partial chip 100 such that the lower side 202 of the second partial chip 200 faces toward the upper side 101 of the first partial chip 100. The upper side 101 of the first partial chip 100 and the lower side 202 of the second partial chip 200 are connected using a solder 150. The first partial chip 100 and the second partial chip 200 therefore form a monolith.

A field-effect transistor 300 is formed in the first partial chip 100 of the optoelectronic component 10. The first partial chip 100 can be, for example, a silicon chip. The field-effect transistor 300 comprises a substrate 340 (bulk or body), a source 310, a drain 320, and a channel 330. The field-effect transistor 300 is configured as a floating gate transistor and therefore comprises, in addition to a control electrode 360, an isolated gate electrode 350. The isolated gate electrode 350 is isolated by isolating areas 130 in relation to the channel 330 and in relation to the control electrode 360.

A light-emitting diode 400 is formed in the second partial chip 200 of the optoelectronic component 10. The second partial chip 200 can be, for example, a III-V semiconductor chip. The light-emitting diode 400 comprises an anode 410 and a cathode 420. In the illustrated example, the anode 410 of the light-emitting diode 400 is adjacent to the lower side 202 of the second partial chip 200, while the cathode 420 is adjacent to the upper side 201 of the second partial chip 200. The light-emitting diode 400 is configured to emit electromagnetic radiation, for example, visible light, at the upper side 201 of the second partial chip 200.

The first partial chip 100 comprises a first through contact 110, which establishes an electrically conductive connection between the drain 320 of the field-effect transistor 300 and the upper side 101 of the first partial chip 100. The second partial chip 200 comprises a through contact 210, which establishes an electrically conductive connection between the cathode 420 of the light-emitting diode 400 and the lower side 202 of the second partial chip 200. The first through contact 110 of the first partial chip 100 and the through contact 210 of the second partial chip 200 are electrically conductively connected using the solder 150 in such a way that the cathode 420 of the light-emitting diode 400 is electrically conductively connected to the drain 320 of the field-effect transistor 300. In this way, the light-emitting diode 400 and the channel 330 of the field-effect transistor 300 are electrically connected in series.

The first partial chip 100 additionally comprises a second through contact 120, which establishes an electrically conductive connection between the upper side 101 and the lower side 102 of the first partial chip 100 and is electrically conductively connected via the solder 150 to the anode 410 of the light-emitting diode 400 of the second partial chip 200. The anode 410 of the light-emitting diode 400 therefore forms a supply contact 510 which is accessible and can be electrically contacted via the second through contact 120 at the lower side 102 of the first partial chip 100.

The source 310 of the field-effect transistor 300 forms a reference contact 520 which is accessible and can be electrically contacted at the lower side 102 of the first partial chip 100. The control electrode 360 of the field-effect transistor 300 is also accessible and can be electrically contacted at the lower side 102 of the first partial chip 100.

Figure 2:
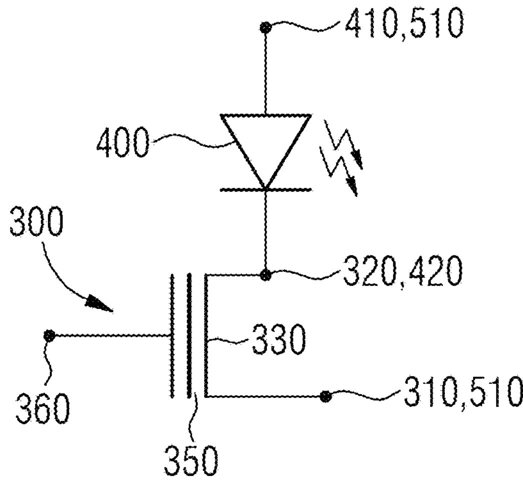
FIG. 2 shows an equivalent circuit diagram of the optoelectronic component.

FIG. 2 shows an equivalent circuit diagram of the optoelectronic component 10 shown in FIG. 1 having the field-effect transistor 300 formed in the first partial chip 100 and the light-emitting diode 400 formed in the second partial chip 200. The light-emitting diode 400 and the channel 330 of the field-effect transistor 300 are electrically connected in series. A supply voltage can be applied between the supply contact 510 and the reference contact 520. The electric current flowing through the light-emitting diode 400 is dependent here on the electrical resistance of the channel 330 of the field-effect transistor 300. The brightness of the electromagnetic radiation emitted by the light-emitting diode 400 can therefore be set using the field-effect transistor 300 to a value from a continuous value range.

In operation of the optoelectronic component 10, the desired brightness of the light-emitting diode 400 is set independently of the actuation of the light-emitting diode 400. In a first step, the isolated gate electrode 350 of the field-effect transistor 300 is electrically charged. The electrical resistance of the channel 330 of the field-effect transistor 300 is thus set in a nonvolatile manner. In a second step, the light-emitting diode 400 is energized by applying the supply voltage between the supply contact 510 and the reference contact 520 and therefore excited to emit electromagnetic radiation of the desired brightness. The brightness of the electromagnetic radiation emitted by the light-emitting diode 400 remains the same here until the electric charge applied to the isolated gate electrode 350 of the field-effect transistor 300 changes.

The application of an electric charge to the isolated gate electrode 350 of the field-effect transistor 300 can take place, for example, by Fowler-Nordheim tunneling. For this purpose, a positive electric voltage is applied between the control electrode 360 and the source 310 of the field-effect transistor 300, thus between the control electrode 360 and the reference contact 520 in the optoelectronic component 10 shown in FIG. 1. The supply contact 510 can be set here to the potential of the reference contact 520. The electric voltage applied between the control electrode 360 and the source 310 can be, for example, 20 V. Negative electric charges then reach the isolated gate electrode 350 from the channel 330 of the field-effect transistor 300 by way of a quantum-mechanical tunneling process.

The electric charge applied to the isolated gate electrode 350 of the field-effect transistor 300 can remain in operation of the optoelectronic component 10 as long as the desired brightness of the electromagnetic radiation emitted by the light-emitting diode 400 does not change, without a further actuation of the control electrode 360 of the field-effect transistor 300 being required for this purpose. If the desired brightness of the electromagnetic radiation emitted by the light-emitting diode 400 changes, a change of the electric charge applied to the isolated gate electrode 350 of the field-effect transistor 300 is required. Either additional charging of the isolated gate electrode 350 can take place or removal of at least a part of the electric charge located on the isolated gate electrode 350.

At least a part of the electric charge located on the isolated gate electrode 350 can be removed by applying a positive electric voltage between the source 310 of the field-effect transistor 300 and the control electrode 360, thus by applying a positive electric voltage between the reference contact 520 and the control electrode 360 in the optoelectronic component 10 shown in FIG. 1. The supply contact 510 can be set here to the potential of the source 310, thus to the potential of the reference contact 520 in the optoelectronic component 10 shown in FIG. 1. The voltage applied between the source 310 of the field-effect transistor 300 and the control electrode 360 can be 10 V, for example. At least a part of the electric charge located on the isolated gate electrode 350 is removed here by a quantum-mechanical tunneling process from the isolated gate electrode 350 to the channel 330 of the field-effect transistor 300.

To produce the optoelectronic component 10, the first partial chip 100 having the field-effect transistor 300 formed therein and the second partial chip 200 having the light-emitting diode 400 formed therein are initially provided separately from one another. The second partial chip 200 is then arranged on the upper side 101 of the first partial chip 100 in such a way that the light-emitting diode 400 and the channel 330 of the field-effect transistor 300 are electrically connected in series. For this purpose, the lower side 202 of the second partial chip 200 and the upper side 101 of the first partial chip 100 are connected to one another using the solder 150.

Figure 3:
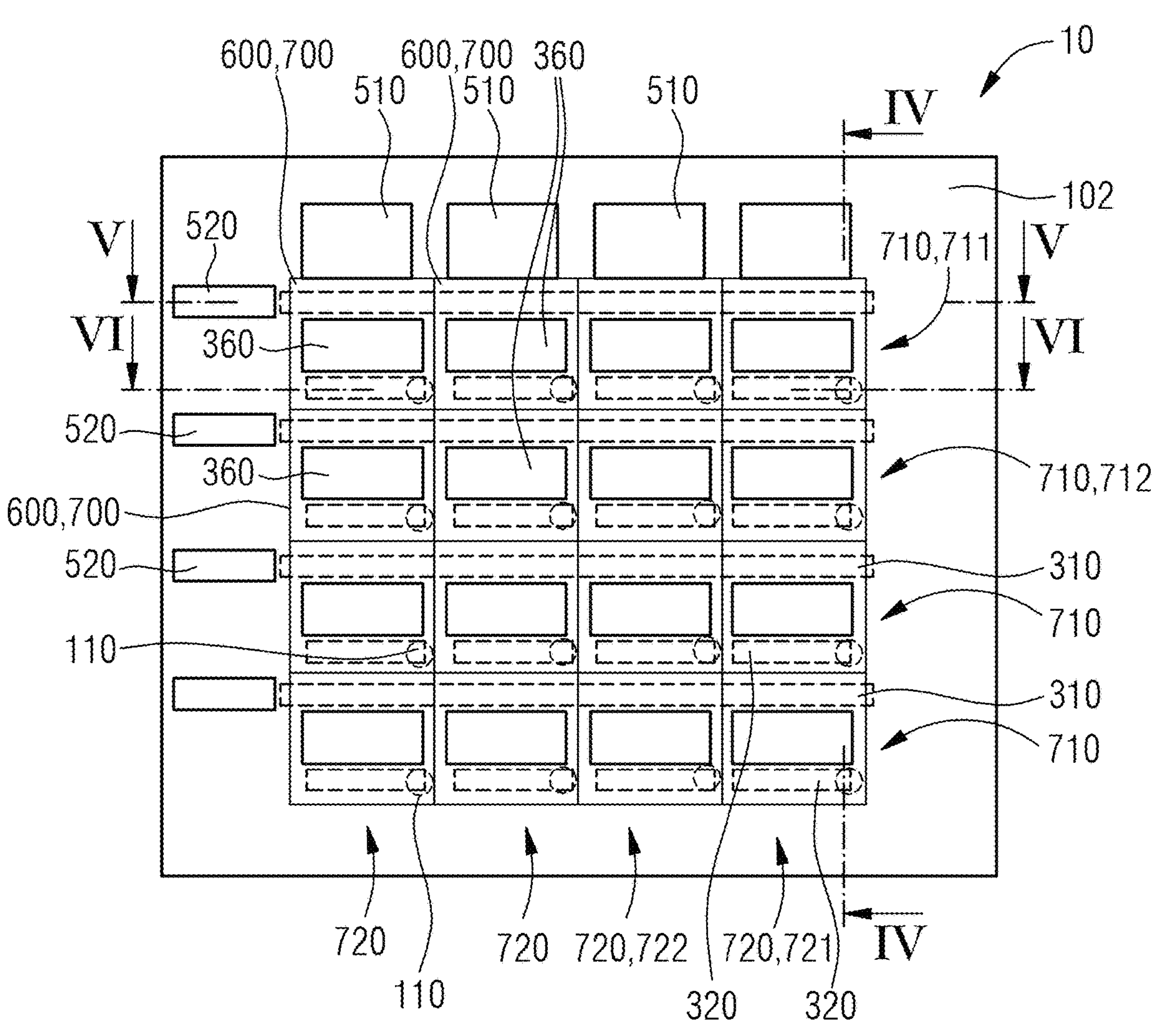
FIG. 3 shows a top view of an optoelectronic component having multiple pixels in a matrix array.

FIG. 3 shows a schematic representation of a further variant of the optoelectronic component 10. A partially transparent view of the lower side 102 of the first partial chip 100 is shown.

The variant of the optoelectronic component 10 shown in FIG. 3 differs from the variant shown in FIG. 1 in that it comprises a plurality of equivalent pixels 600. The pixels 600 can also be referred to as image points. Each of the pixels 600 comprises a field-effect transistor 300 and a light-emitting diode 400. Therefore, each pixel 600 is essentially configured like the optoelectronic component 10 described on the basis of FIG. 1, wherein the special features described hereinafter are to be taken into consideration. The variant of the optoelectronic component 10 shown in FIG. 3 can be, for example, a display screen (display).

The pixels 600 of the variant of the optoelectronic component 10 shown in FIG. 3 are arranged in a two-dimensional matrix array 700 having rows 710 and columns 720. The field-effect transistors 300 of the individual pixels 600 are oriented here so that the channels 330 of the field-effect transistors 300 are aligned parallel to the columns 720. In the example shown in FIG. 3, the matrix array 700 comprises sixteen pixels 600, which are arranged in four rows 710 and four columns 720. A different number of rows 710 and columns 720 is possible, however.

All pixels 600 of the optoelectronic component 10 are jointly monolithically integrated. This means that the field-effect transistors 300 of all pixels 600 are formed jointly in the first partial chip 100 of the optoelectronic component 10. The light-emitting diodes 400 of all pixels 600 are formed jointly in the second partial chip 200. The second partial chip 200 is arranged on the upper side 101 of the first partial chip 100, so that the first partial chip 100 and the second partial chip 200 form a monolith.

Figures 4, 5:
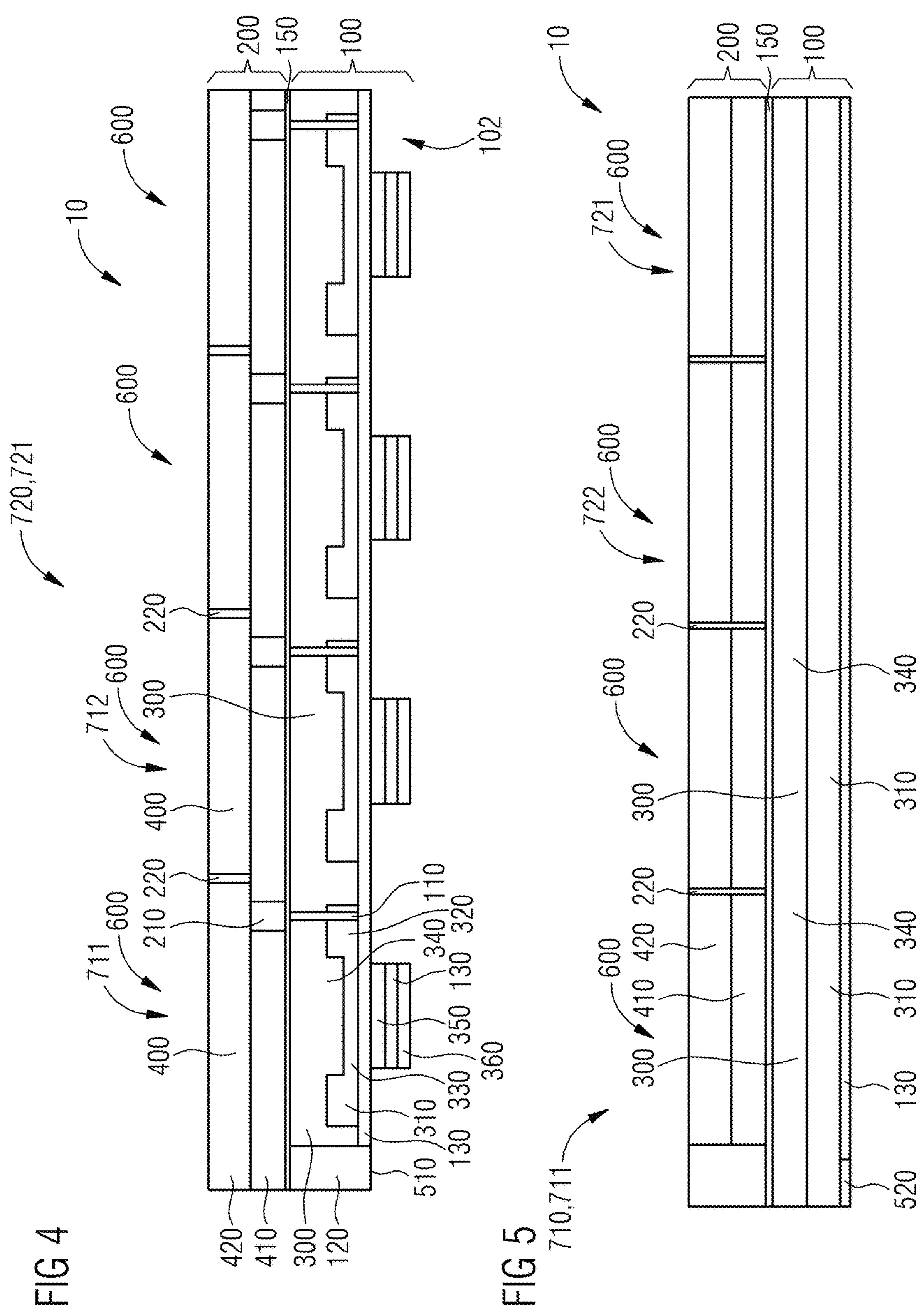
FIG. 4 shows a first sectional view of this optoelectronic component.
FIG. 5 shows a second sectional view of this optoelectronic component.
Figure 6:
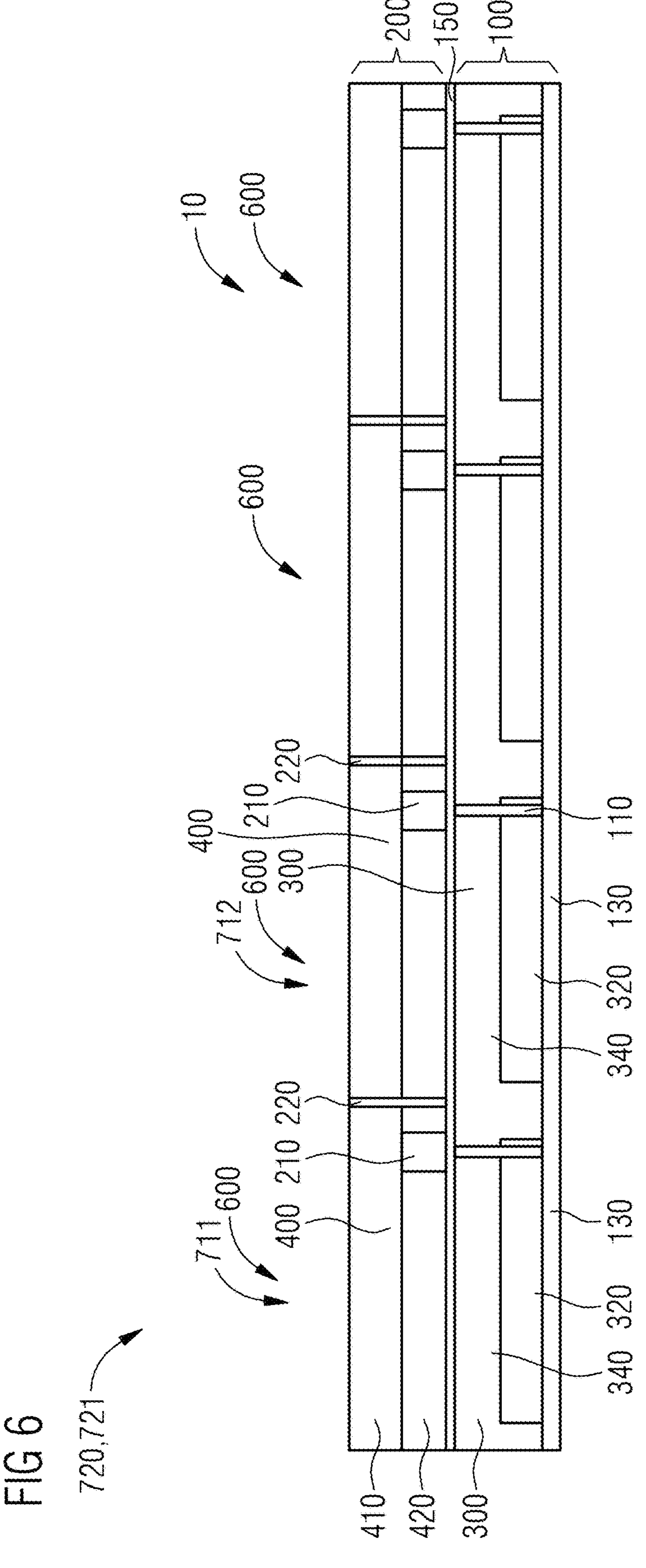
FIG. 6 shows a third sectional view of this optoelectronic component.

FIG. 4 shows a first schematic sectional view of the optoelectronic component 10 of FIG. 3. The section extends here through a first column 720, 721 of the matrix array 700. FIG. 5 shows a schematic representation of a second sectional view of the optoelectronic component 10 of FIG. 3. The section extends here through the sources 310 of the field-effect transistors 300 of the pixels 600 of a first row 710, 711 of the matrix array 700. FIG. 6 shows a schematic representation of a third sectional view of the optoelectronic component 10 of FIG. 3. The section extends here through the drains 320 of the field-effect transistors 300 of the pixels 600 of the first row 710, 711 of the matrix array 700.

FIG. 4 shows that the anodes 410 of the light-emitting diodes 400 of all pixels 600 arranged in a common column 720 are electrically short-circuited. The anodes 410 of the light-emitting diodes 400 of pixels 600 arranged in different columns 720 are electrically isolated from one another by isolating areas 220, in contrast, as can be seen in FIGS. 5 and 6. The cathodes 420 of the light-emitting diodes 400 of the different pixels 600 are electrically isolated from one another both row by row and column by column by isolating areas 220.

It can be seen in FIG. 5 that the sources 310 of the field-effect transistors 300 of all pixels 600 arranged in a common row 710 are electrically short-circuited. The drains 320 of the field-effect transistors 300 of the pixels 600 arranged in a common row 710 of the matrix array 700 are electrically isolated from one another, in contrast, as can be seen in FIG. 6. In the case of pixels 600 arranged in different columns 720 of the matrix array 700, both the sources 310 and the drains 320 are isolated from one another.

In the variant of the optoelectronic component 10 shown in FIG. 3, the first through contact 110 of the first partial chip 100 and the through contact 210 of the second partial chip 200 are present in each pixel 600 and establish in each pixel 600 an electrically conductive connection between the cathode 420 of the light-emitting diode 400 and the drain 320 of the field-effect transistor 300. The second through contact 120 of the first partial chip 100, in contrast, is only present once per column 720 of the matrix array 700, so that on the lower side 102 of the first partial chip 100, only one supply contact 510 is provided per column 720 of the matrix array 700 and provides an electrically conductive connection to the anodes 410, which are short-circuited column by column, of the light-emitting diodes 400. This can be seen in FIGS. 3 and 4. Furthermore, in the variant of the optoelectronic component 10 shown in FIG. 3, on the lower side 102 of the first partial chip 100, only one reference contact 520 is present per row 710 of the matrix array 700, which provides in each case an electrically conductive connection to the sources 310, which are short-circuited row by row, of the field-effect transistors 300 of the pixels 600 of the respective row 710. This can be seen in FIGS. 3 and 5. The supply contacts 510 and the reference contacts 520 can be accessible and able to be electrically contacted, for example, at two outer sides of the matrix array 700 at the lower side 102 of the first partial chip 100, as is shown in FIG. 3.

Figure 7:
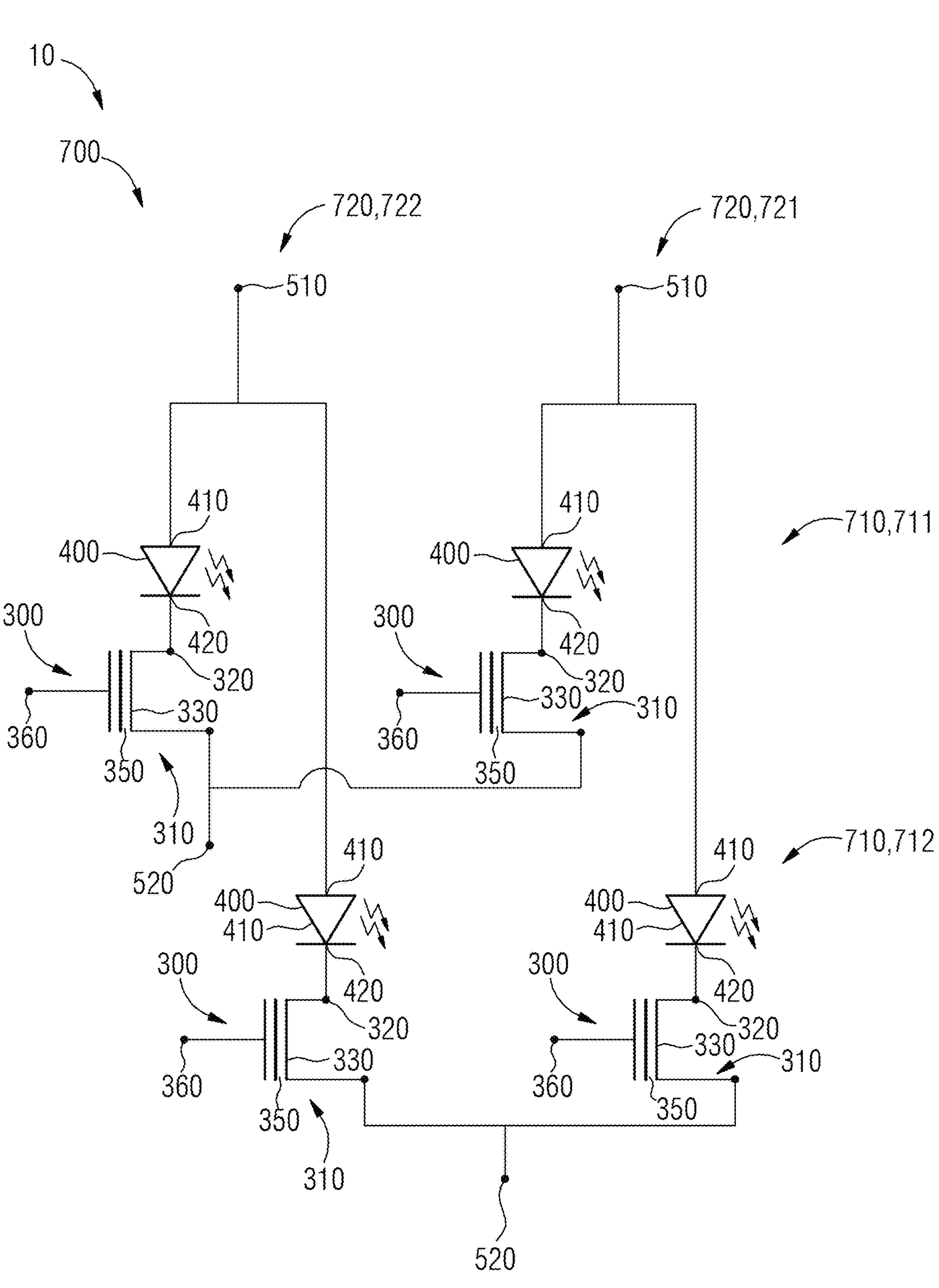
FIG. 7 shows a part of an equivalent circuit diagram of this optoelectronic component.

FIG. 7 shows a part of an equivalent circuit diagram of the variant of the optoelectronic component 10 shown in FIG. 3. Only the first row 710, 711 and a second row 710, 712 as well as the first column 720, 721 and a second column 720, 722 of the matrix array 700 are shown.

In operation of the variant of the optoelectronic component 10 shown in FIG. 3, initially a defined electric charge is applied to the isolated gate electrode 350 of the respective field-effect transistor 300 at each pixel 600 in order to set a desired brightness of the light emitted by the associated light-emitting diode 400. The light-emitting diodes 400 of all pixels 600 are then energized in that the supply voltage is applied between the supply contacts 510 and the reference contacts 520 of the optoelectronic component 10. The supply contacts 510 of the various columns 720 and the reference contacts 520 of the various rows 710 can each be set to a common potential here.

The electric charge applied to the isolated gate electrode 350 of the field-effect transistor 300 of a pixel 600 remains unchanged as long as the desired brightness of the electromagnetic radiation emitted by the associated light-emitting diode 400 of the pixel 600 does not change. The electric charge applied to the isolated gate electrode 350 of the respective field-effect transistor 300 is only changed when the desired brightness changes at a pixel 600. This has the advantage that, for example, in a representation of moving images, the electric charge applied to the isolated gate electrode 350 only has to be changed between the representation of two chronologically successive images in a part of the pixels 600.

The application of electric charge to the isolated gate electrode 350 and the removal of at least a part of the electric charge located on the isolated gate electrode 350 can take place as explained above with reference to FIG. 1. To apply an electric charge to the isolated gate electrode 350 of a pixel 600, a positive electric voltage can be applied between the control electrode 360 of the respective pixel 600 and the source 310 of the field-effect transistor 300 of this pixel 600, thus between the control electrode 360 and the reference contact 520, which is connected to the source 310, of the associated row 710 of the matrix array 700. To remove at least a part of the electric charge located on the isolated gate electrode 350 of a pixel 600, a positive electric voltage can be applied between the source 310 of the field-effect transistor 300 of this pixel 600 and the control electrode 360 of the field-effect transistor 300, thus between the reference contact 520, which is connected to the source 310, of the respective row 710 of the matrix array 700 and the control electrode 360. The supply contact 510 of the associated column 720 of the matrix array 700 can be set in both cases to the same potential as the reference contact 520 of the respective row 710.

In a variant of the optoelectronic component 10 which is not shown in the figures, the anodes 410 of the light-emitting diodes 400 of the various pixels 600 are not only short-circuited column by column. Instead, the anodes 410 of all pixels 600 of the matrix array 700 are electrically conductively connected to one another. In this variant, it can be sufficient to provide the second through contact 120 only once for the entire optoelectronic component 10. However, it can be expedient to nonetheless form a second through contact 120 per column 720 of the matrix array 700 in each case.

Figure 8:
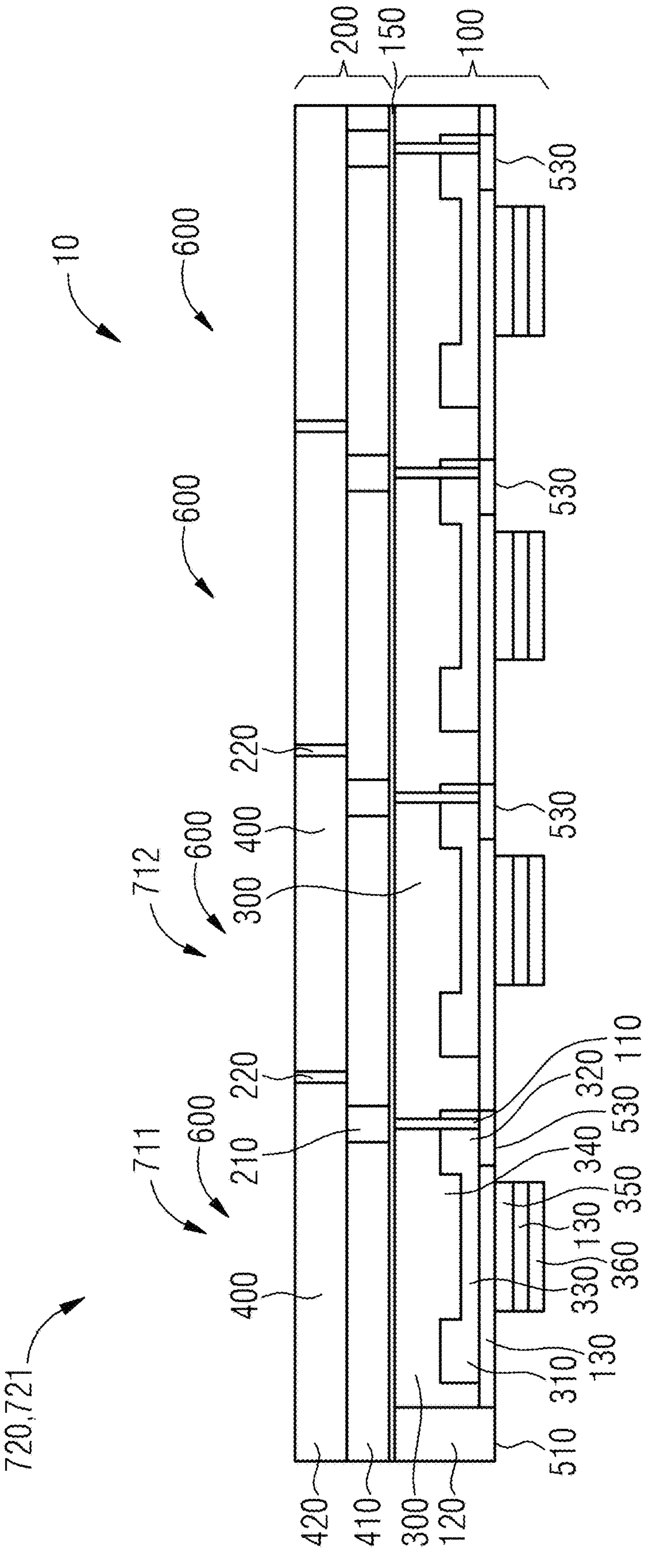
FIG. 8 shows a sectional view of a further variant of the optoelectronic component.

FIG. 8 Shows a Schematic Sectional Representation of a further variant of the optoelectronic component 10. The section extends here, as in the representation of FIG. 4, through the pixels 600 of the first column 720, 721 of the matrix array 700.

The variant of the optoelectronic component 10 shown in FIG. 8 differs from the variant of the optoelectronic component 10 explained on the basis of FIGS. 3 to 7 in that in each pixel 600, the drain 320 of the field-effect transistor 300 can be electrically contacted at the lower side 102 of the first partial chip 100. Otherwise, the above description of the variant of FIGS. 3 to 7 also applies for the variant of FIG. 8.

In the variant of the optoelectronic component 10 shown in FIG. 8, the method described above with reference to FIG. 3 can be used to apply an electric charge to the isolated gate electrode 350 of a pixel 600. Alternatively, a channel hot electron method can be used in the variant shown in FIG. 8, in which, to apply an electric charge to the isolated gate electrode 350 of a pixel 600, a positive electric voltage is applied between the drain 320 of the field-effect transistor 300 of the pixel 600 and the source 310 of the field-effect transistor 300 of the pixel 600 and additionally a positive electric voltage is applied between the control electrode 360 and the drain 320 of the field-effect transistor 300 of the pixel 600. The source 310 of the field-effect transistor 300 is again contacted here via the reference contact 520 of the respective row 710 of the matrix array 700. For example, a voltage of 5 V can be applied between the drain 320 and the source 310 of the field-effect transistor 300 and a voltage of 5 V can likewise be applied between the control electrode 360 and the drain 320, so that a voltage of 10 V results between the control electrode 360 and the source 310. This method for applying an electric charge to the isolated gate electrode 350 can be faster than the method described above with reference to FIG. 3, but can be accompanied by an increased energy consumption.

Figure 9:
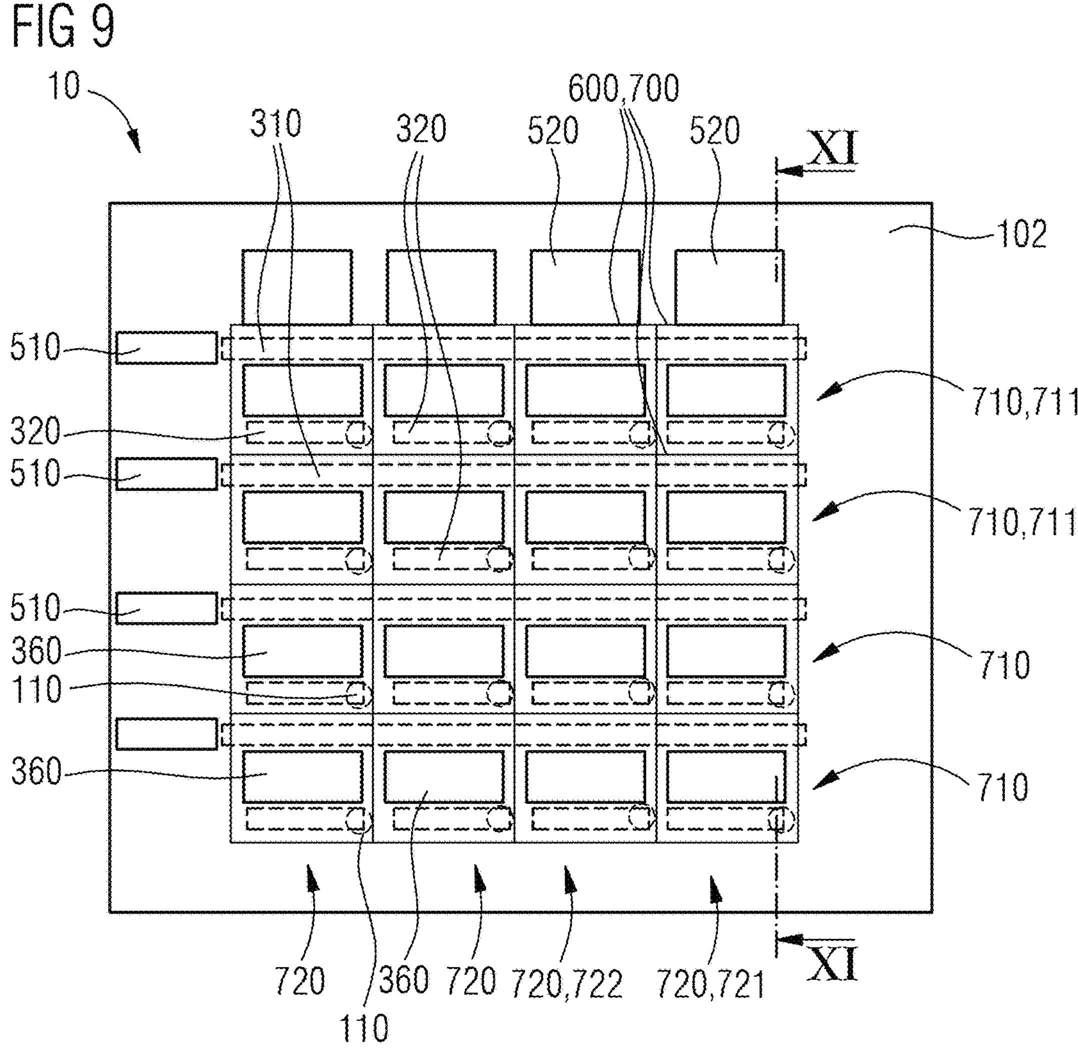
FIG. 9 shows a top view of this variant of the optoelectronic component.

FIG. 9 shows a schematic representation of a partially transparent view of the lower side 102 of the first partial chip 100 of a further variant of the optoelectronic component 10. The variant of the optoelectronic component 10 shown in FIG. 9 differs from the variant of the optoelectronic component 10 described with reference to FIG. 3 due to a changed internal interconnection, so that in the variant of the optoelectronic component 10 shown in FIG. 9, the equivalent circuit diagram shown in FIG. 10 results for each pixel 600. FIG. 11 shows a section through the first column 720, 721 of the matrix array 700 of the variant of the optoelectronic component 10 shown in FIG. 9.

It will be explained hereinafter how the variant of the optoelectronic component 10 shown in FIGS. 9 to 11 differs from the variant of the optoelectronic component 10 described with reference to FIGS. 3 to 7. Otherwise, the above description of the variant of FIGS. 3 to 7 also applies to the variant of FIGS. 9 to 11.

In the variant of the optoelectronic component 10 shown in FIG. 9, the cathodes 420 of the light-emitting diodes 400 of the pixels 600 of a common column 720 of the matrix array 700 are each electrically short-circuited. The anodes 410 of the light-emitting diodes 400 of the pixels 600 of a common column 720, in contrast, are electrically isolated from one another by isolating areas 220. The anodes 410 of the light-emitting diodes 400 are also electrically isolated from one another row by row. The cathodes 420 of the pixels 600 of a common row 710 of the matrix array 700 can be isolated from one another or electrically conductively connected to one another.

In each pixel 600, an electrically conductive connection is established between the drain 320 of the field-effect transistor 300 and the anode 410 of the light-emitting diode 400 via the first through contact 110 formed in the first partial chip 100. The second through contact 120 of the first partial chip 100, which is only present once per column 720 of the matrix array 700, is accessible and can be electrically contacted at the lower side 102 of the first partial chip 100 as the reference contact 520. The second partial chip 200 comprises, instead of the through contacts 210, through contacts 215 only present once per column 720 of the matrix array 700, which provide electrically conductive connections between the cathodes 420, which are short-circuited column by column, of the light-emitting diodes 400 and the lower side 202 of the second partial chip 200. The through contacts 215, which are present once per column 720 of the matrix array 700, of the second partial chip 200 are electrically conductively connected via the solder 150 connecting the first partial chip 100 and the second partial chip 200 to the second through contacts 120, which are present once per column 720 of the matrix array 700, of the first partial chip 100, so that in each case an electrically conductive connection is established between the cathodes 420 of the light-emitting diodes 400 of the pixels 600 of the respective column 720 and the reference contact 520 of the respective column 720.

The sources 310, which are short-circuited row by row, of the field-effect transistors 300 of the pixels 600 are accessible and can be electrically contacted as supply contacts 510 at the lower side 102 of the first partial chip 100.

Figure 10:
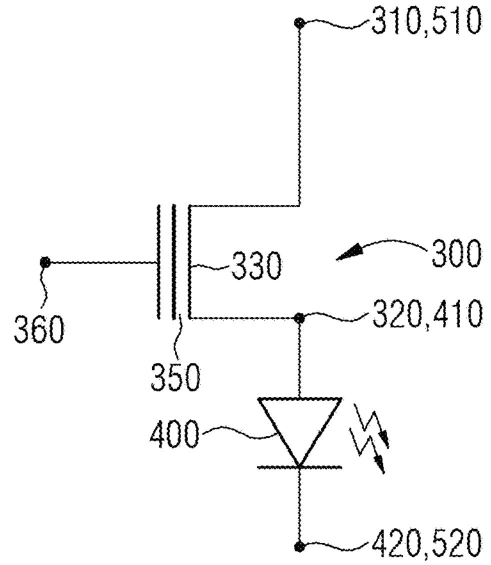
FIG. 10 shows a part of an equivalent circuit diagram of a further variant of an optoelectronic component.
Figures 11, 12:
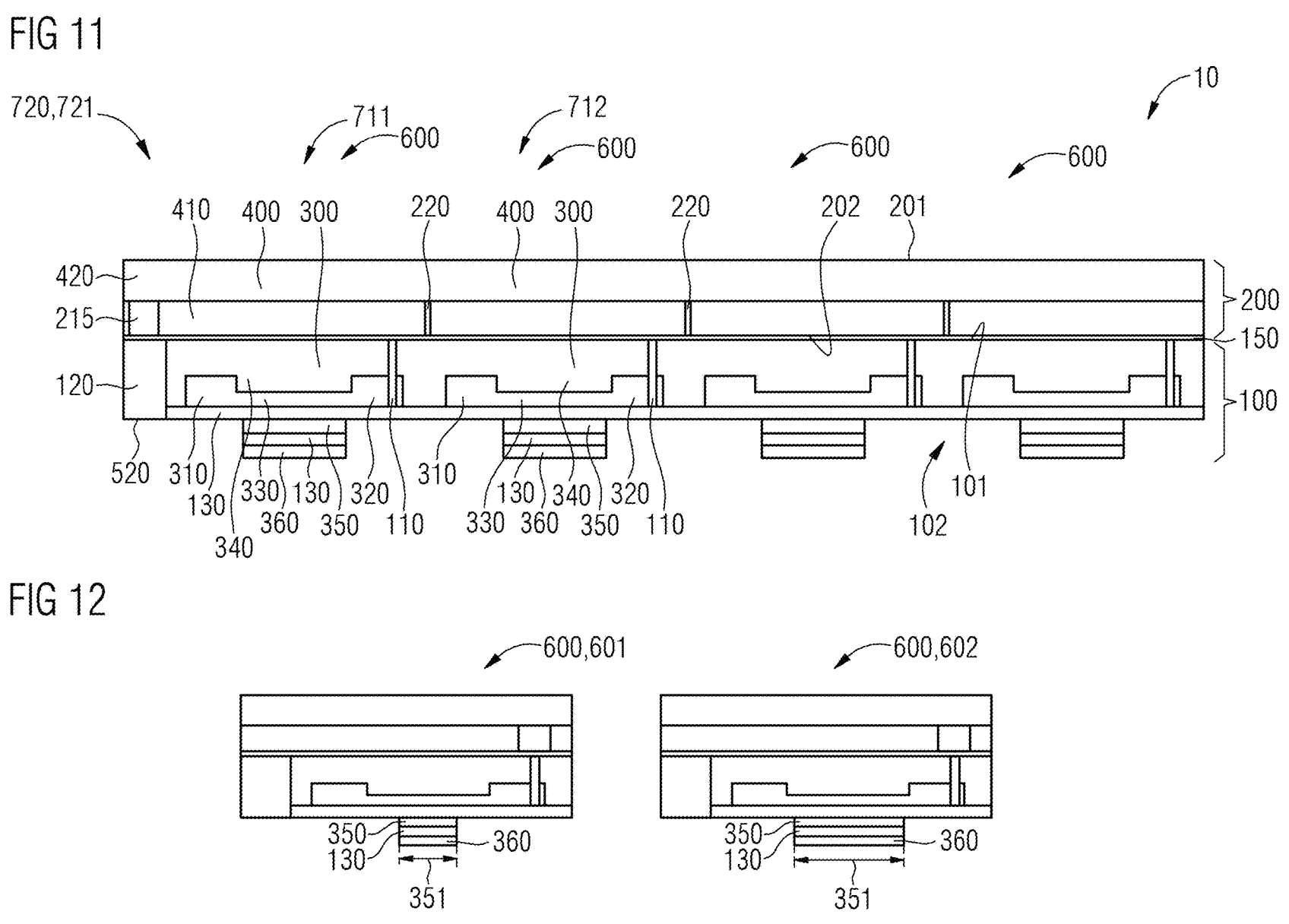

Therefore, the light-emitting diode 400 and the channel 330 of the field-effect transistor 300 are also electrically connected in series at each pixel 600 of the matrix array 700 in the variant of the optoelectronic component 10 shown in FIGS. 9 to 11. A supply voltage can also be applied between the supply contact 510 and the reference contact 520 at each pixel 600 in this variant of the optoelectronic component 10. The supply contact 510 is connected here, however, to the source 310 of the respective field-effect transistor 300, while the reference contact 520 is connected to the cathode 420 of the respective light-emitting diode 400.

The operation of the variant of the optoelectronic component 10 shown in FIGS. 9 to 11 takes place analogously to the operation of the variant shown in FIG. 3. An electric charge is applied to the isolated gate electrode 350 of the field-effect transistor 300 of a pixel 600 by applying a positive electric voltage between the control electrode 360 and the source 310 of the field-effect transistor 300. At least a part of the electric charge located on the isolated gate electrode 350 of the field-effect transistor 300 of a pixel 600 is removed by applying a positive electric voltage between the source 310 of the field-effect transistor 300 and the control electrode 360 of the field-effect transistor 300.

FIG. 12 shows a schematic sectional side view of a first pixel 600, 601 and a second pixel 600, 602 of the matrix array 700 of a variant of the optoelectronic component 10. The two pixels 600 can be arranged at arbitrary positions of the matrix array 700. In the example shown in FIG. 12, the pixels 600 are configured as in the variant of the optoelectronic component 10 shown in FIG. 3. The pixels 600 could also be configured, however, as in the variant of the optoelectronic component 10 shown in FIG. 9 or as in another described variant of the optoelectronic component 10.

The isolated gate electrode 350 of the first pixel 600, 601 and the isolated gate electrode 350 of the second pixel 600, 602 each have a lateral extension 351. The lateral extension 351 of the isolated gate electrode 350 of the first pixel 600, 601 is less here than the lateral extension 351 of the isolated gate electrode 350 of the second pixel 600, 602. A lateral extension of the control electrode 360 corresponds in both pixels 600 to that of the associated isolated gate electrode 350.

The different lateral extensions 351 of the isolated gate electrodes 350 of the different pixels 600 can be used to balance out different electro-optical properties of the light-emitting diodes 400 of the different pixels 600. The different electro-optical properties can be, for example, different brightnesses of the light-emitting diodes 400 of the different pixels 600. In order to achieve this, during the production of the optoelectronic component 10, the electro-optical property in question of the respective light-emitting diode 400 can initially be detected at each pixel 600 in a first method step. In a second step, the lateral extension 351 of the isolated gate electrode 350 of the respective field-effect transistor 300 is then adapted depending on the detected electro-optical property. It is therefore possible that in the following operation of the optoelectronic component 10, a charge of the isolated gate electrode 350 taking place in the same manner at each pixel 600 results in an identical or at least approximately identical behavior of the light-emitting diode 400 of the respective pixel 600, for example, in an identical or similar brightness of the electromagnetic radiation emitted by the respective light-emitting diode 400.

Figure 13:
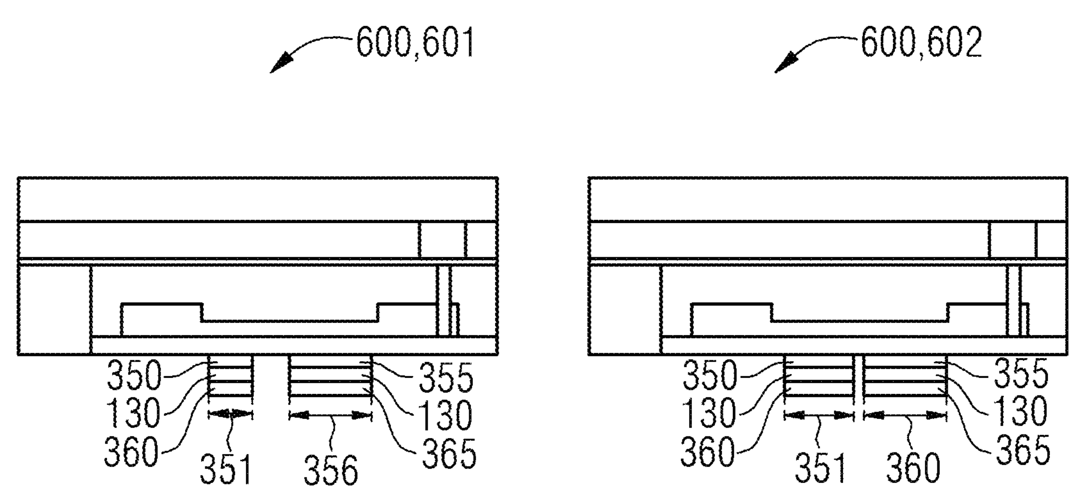
FIG. 13 shows a sectional view of two pixels of yet a further variant of an optoelectronic component.

FIG. 13 shows a schematic sectional side view of a first pixel 600, 601 and a second pixel 600, 602 of a further variant of the optoelectronic component 10. The pixels 600 can again be arranged at arbitrary positions of the matrix array 700 of the optoelectronic component 10. In the example shown in FIG. 13, the pixels 600 are configured as in the variant of the optoelectronic component 10 shown in FIG. 3. However, the pixels 600 could also be configured as in one of the other described variants of the optoelectronic component 10.

In the variant of the optoelectronic component 10 shown in FIG. 13, each pixel 600 comprises, in addition to the control electrode 360 and isolated gate electrode 350, a further control electrode 365 and a further isolated gate electrode 355. The further isolated gate electrode 355 and the further control electrode 365 are arranged in the lateral direction adjacent to the isolated gate electrode 350 and the control electrode 360. The isolated gate electrode 350 has the lateral extension 351 in each case. The further isolated gate electrode 355 has a further lateral extension 356 in each case. The lateral extension 351 and the further lateral extension 356 can be equal or different in each pixel 600. In addition, the lateral extensions 351 or the further lateral extensions 356 of different pixels 600 can differ from one another.

In the variant of the optoelectronic component 10 shown in FIG. 13, the further isolated gate electrode 355 at each pixel 600 can be intended to compensate for a component-individual deviation of an electro-optical property of the light-emitting diode 400 of the respective pixel 600, for example, a component-individual brightness of the light-emitting diode 400 of the pixel 600. For this purpose, the further isolated gate electrode 355 at each pixel 600 can be permanently subjected to an electric charge, which has the result that an equal charging of the isolated gate electrode 350 subsequently results in an identical or approximately identical behavior of the respective light-emitting diode 400 at all pixels 600 of the matrix array 700, for example, in an identical or similar brightness of the emitted electromagnetic radiation.

The invention was illustrated and described in more detail on the basis of the preferred exemplary embodiments. Nonetheless, the invention is not restricted to the disclosed examples. Other variations can be derived by a person skilled in the art.

LIST OF REFERENCE SIGNS

10 optoelectronic component
100 first partial chip

101 upper side
102 lower side
110 first through contact
120 second through contact
130 isolating area
150 solder
200 second partial chip
201 upper side
202 lower side
210 through contact
215 through contact
220 isolating area
300 field-effect transistor
310 source
320 drain
330 channel
340 substrate
350 isolated gate electrode
351 lateral extension
355 further isolated gate electrode
356 further lateral extension
360 control electrode
365 further control electrode
400 light-emitting diode
410 anode
420 cathode
510 supply contact
530 drain contact
600 pixel
601 first pixel
602 second pixel
700 matrix array
710 row
711 first row
712 second row
720 column
721 first column
722 second column

The invention claimed is:

1. An optoelectronic component, comprising:

a field-effect transistor formed in a first partial chip, having a source and a drain, wherein the field-effect transistor is configured as a floating gate transistor having a control electrode and an isolated gate electrode, and a light-emitting diode, which is formed in a second partial chip, having an anode and a cathode, wherein the second partial chip is arranged on an upper side of the first partial chip, wherein the light-emitting diode and a channel of the field-effect transistor are electrically connected in series, wherein the field-effect transistor is intended to set a brightness value of the light-emitting diode, and wherein the field-effect transistor comprises, in addition to the control electrode and the isolated gate electrode, a further control electrode and a further isolated gate electrode.

2. The optoelectronic component according to claim 1, wherein the cathode of the light-emitting diode is electrically conductively connected to the drain of the field-effect transistor, wherein the anode of the light-emitting diode forms a supply contact, wherein the source of the field-effect transistor forms a reference contact, wherein a supply voltage can be applied between the supply contact and the reference contact.

3. The optoelectronic component according to claim 1, wherein the anode of the light-emitting diode is electrically conductively connected to the drain of the field-effect transistor, wherein the source of the field-effect transistor forms a supply contact, wherein the cathode of the light-emitting diode forms a reference contact, wherein a supply voltage can be applied between the supply contact and the reference contact.

4. The optoelectronic component according to claim 2, wherein the control electrode of the field-effect transistor, the supply contact, and the reference contact can be electrically contacted at a lower side of the first partial chip.

5. The optoelectronic component according to claim 4, wherein the drain of the field-effect transistor can be electrically contacted at the lower side of the first partial chip.

6. The optoelectronic component according to claim 1, wherein the first partial chip comprises a through contact, via which the light-emitting diode and the channel of the field-effect transistor are electrically connected in series.

7. The optoelectronic component according to claim 1, wherein the first partial chip is formed as a silicon chip, wherein the second partial chip is formed as a III-V semiconductor chip.

8. The optoelectronic component according to claim 1, wherein the light-emitting diode and the field-effect transistor jointly form a pixel of the optoelectronic component, wherein the optoelectronic component comprises a plurality of further equivalent pixels, wherein all pixels are jointly monolithically integrated.

9. The optoelectronic component according to claim 8, wherein respective isolated gate electrodes of two pixels have different lateral extensions.

10. The optoelectronic component according to claim 8, wherein the cathode of the light-emitting diode is electrically conductively connected to the drain of the field-effect transistor, wherein the anode of the light-emitting diode forms a supply contact, wherein the source of the field-effect transistor forms a reference contact, wherein a supply voltage can be applied between the supply contact and the reference contact, wherein the pixels are arranged in a matrix array having rows and columns, wherein respective sources of respective field-effect transistors of the pixels are electrically short-circuited row by row, wherein respective anodes of respective light-emitting diodes of the pixels are electrically short-circuited column by column.

11. The optoelectronic component according to claim 8, wherein the anode of the light-emitting diode is electrically conductively connected to the drain of the field-effect transistor, wherein the source of the field-effect transistor forms a supply contact, wherein the cathode of the light-emitting diode forms a reference contact, wherein a supply voltage can be applied between the supply contact and the reference contact, wherein the pixels are arranged in a matrix array having rows and columns, wherein respective sources of respective field-effect transistors of the pixels are electrically short-circuited row by row, wherein respective cathodes of respective light-emitting diodes of the pixels are electrically short-circuited column by column.

12. The optoelectronic component of claim 1, wherein the optoelectronic component is capable of:
applying an electric charge to the isolated gate electrode in order to set the brightness value of the light-emitting diode; and
energizing the light-emitting diode.

13. The optoelectronic component according to claim 12, wherein the electric charge is applied to the isolated gate electrode by applying a positive electric voltage between the control electrode and the source of the field-effect transistor.

14. The optoelectronic component according to claim 12, wherein the cathode of the light-emitting diode is electrically conductively connected to the drain of the field-effect transistor,
wherein the anode of the light-emitting diode forms a supply contact,
wherein the source of the field-effect transistor forms a reference contact,
wherein a supply voltage is configured to be applied between the supply contact and the reference contact,
wherein the control electrode of the field-effect transistor, the supply contact, and the reference contact is configured to be electrically contacted at a lower side of the first partial chip,
wherein the drain of the field-effect transistor is configured to be electrically contacted at the lower side of the first partial chip,
wherein the electric charge is applied to the isolated gate electrode by applying a positive electric voltage between the drain of the field-effect transistor and the source of the field-effect transistor and applying the positive electric voltage between the control electrode and the drain of the field-effect transistor.

15. The optoelectronic component according to claim 12, wherein the cathode of the light-emitting diode is electrically conductively connected to the drain of the field-effect transistor,
wherein the anode of the light-emitting diode forms a supply contact,
wherein the source of the field-effect transistor forms a reference contact,
wherein a supply voltage is configured to be applied between the supply contact and the reference contact,
wherein the light-emitting diode is energized by applying a positive supply voltage between the supply contact and the reference contact.

16. The optoelectronic component according to claim 12, further wherein the optoelectronic component is capable of:
removing at least a part of the electric charge located on the isolated gate electrode.

17. The optoelectronic component according to claim 16, wherein at least a part of the electric charge located on the isolated gate electrode is removed by applying a positive electric voltage between the source of the field-effect transistor and the control electrode.

18. The optoelectronic component according to claim 12, wherein the anode of the light-emitting diode is electrically conductively connected to the drain of the field-effect transistor,
wherein the source of the field-effect transistor forms a supply contact, wherein the cathode of the light-emitting diode forms a reference contact,
wherein a supply voltage is configured to be applied between the supply contact and the reference contact, wherein the control electrode of the field-effect transistor, the supply contact, and the reference contact is configured to be electrically contacted at a lower side of the first partial chip,
wherein the drain of the field-effect transistor is configured to be electrically contacted at the lower side of the first partial chip,
wherein the electric charge is applied to the isolated gate electrode by applying a positive electric voltage between the drain of the field-effect transistor and the source of the field-effect transistor and applying the positive electric voltage between the control electrode and the drain of the field-effect transistor.

19. A method for producing an optoelectronic component comprising:
providing a field-effect transistor, which is formed in a first partial chip, comprising a source and a drain, wherein the field-effect transistor is configured as a floating gate transistor comprising a control electrode and an isolated gate electrode,
wherein the field-effect transistor comprises, in addition to the control electrode and the isolated gate electrode, a further control electrode and a further isolated gate electrode;
providing a light-emitting diode, which is formed in a second partial chip, comprising an anode and a cathode;
arranging the second partial chip on an upper side of the first partial chip, wherein the light-emitting diode and a channel of the field-effect transistor are electrically connected in series, wherein the field-effect transistor is intended to set a brightness value of the light-emitting diode.

20. The method according to claim 19, further comprising:
detecting an electro-optical property of the light-emitting diode;
adapting a lateral extension of the isolated gate electrode of the field-effect transistor depending on the electro-optical property.

* * * * *